United States Patent [19]
Chieli

[11] Patent Number: 4,942,309
[45] Date of Patent: Jul. 17, 1990

[54] HIGH SIDE DRIVER MOS CIRCUIT
[75] Inventor: Davide Chieli, Milan, Italy
[73] Assignee: SGS-Thomson Microelectronics, s.r.l., Italy
[21] Appl. No.: 313,556
[22] Filed: Feb. 22, 1989
[30] Foreign Application Priority Data
Feb. 25, 1988 [IT] Italy ................... 83616 A/88
[51] Int. Cl.$^5$ .................... H03K 17/16; H03K 17/60
[52] U.S. Cl. ................... 307/270; 307/443; 307/570; 307/247.1; 307/272.1
[58] Field of Search ............ 307/270, 570, 443, 448, 307/451, 247.1, 450, 272.1; 357/23.4

[56] References Cited
U.S. PATENT DOCUMENTS

| | | | |
|---|---|---|---|
| 4,498,021 | 2/1985 | Uya | 307/270 |
| 4,677,324 | 6/1987 | Ronan, Jr. et al. | 307/247.1 |
| 4,837,458 | 6/1989 | Kawahato et al. | 307/451 |

Primary Examiner—Stanley D. Miller
Assistant Examiner—M. Wambach
Attorney, Agent, or Firm—Pollock, Vande Sande & Priddy

[57] ABSTRACT

A MOS high side driver circuit switching a supply voltage by means of a power switching transistor M1 driven by a driving circuit in function of a drive switching signal C, utilizes a flip-flop for driving the gate of the power switching transistor M1. The inputs SET and RESET of the flip-flop are respectively connected to the drain node of two, grounded source, input transistors supplied from a $V_{GG}$ rail maintained at a constant potential difference from the source (output) node of the power switching transistor M1. Two pulse signals $C_R$, $C_S$ and corresponding to a rising and to a falling edge of the drive switching signal C from which they are derived by suitable circuit means, are respectively applied to the gates of the two input transistors. The driving circuit dissipates only during transitions in contrast to the driving circuits of the prior art.

5 Claims, 2 Drawing Sheets

HIGH SIDE DRIVER MOS CIRCUIT

BACKGROUND OF THE INVENTION

1. Field of the invention

The present invention relates to integrated MOS circuits and particularly to a circuit for driving a power MOS transistor.

2. Description of the Prior Art

The driving of a power MOS transistor under certain circumstances presents problems. This is the case for instance of a power MOS transistor of an output stage of a logic circuit utilized for switching a supply voltage across an externally connected load. In this situation, in order to ensure a complete turning-on (saturation) of the power transistor during an ON period, a relatively high voltage must be maintained between the gate and the source of the transistor (in the order of about 10 Volts). Should a normal bias configuration be used for the power transistor, an excessive voltage drop across the transistor itself would develop.

In these instances, particular circuit techniques are used which allow for the gate voltage to reach absolute levels even higher than the drain voltage of the power transistor. A known practice is to use the so-called "bootstrap" circuit which is essentially a regenerative feedback circuit used for increasing the gate potential with respect to the source (output node) potential. An alternative circuit arrangement of the prior art contemplates the "release" of the gate potential from the drain potential of the output transistor by utilizing a constant voltage generator connected between the output node OUT (source of the power output transistor) and a $V_{GG}$ node and by supplying the driving device of the power transistor from these circuit nodes. In this way, the gate voltage of the power transistor may assume a value close to the voltage $V_{GG}$, which may also be higher than the drain voltage $V_{DD}$ of the power transistor when the latter is conducting.

An example of a driving circuit of this known type (high side driver) is depicted in FIGS. 1, 2 and 3. The potential difference between the nodes $V_{SS}$ and $V_{GG}$ is maintained constant by means of a suitable voltage generator (a battery or a power supply) while the absolute value of the voltage of nodes $V_{GG}$ and $V_{SS}$ depends on the state (ON or OFF) of the power transistor M1, which switches a supply voltage $V_{DD}$ across the load Zc in function of a driving signal C which is applied to the gate of the driver transistor M2, which may be considered the input terminal IN of the driving circuit.

Block 2 of FIG. 1 is essentially an amplifier A, as depicted in FIGS. 2 and 3. In both circuits, the switching OFF and ON of the input transistor M2 causes, by means of the amplifier A, the switching ON and the switching OFF of the power transistor M1. A limiting diode D is commonly added in order to protect the input of the amplifier A when the transistor M2 is ON by preventing the potential at the input of the amplifier A to become eccessively negative with respect to the voltage $V_{SS}$.

A current generator I (FIG. 2), or a resistor $R_p$ (FIG. 3) ensures the maintainance of the drain potential of the transistor M2 at a correct logic level (1) when the transistor is OFF.

In general, the driving circuits in accordance with the prior art, have the disadvantage of dissipating energy during the periods when the transistor M2 is ON and the state of the output transistor M1 is tied to the state of the input transistor M2 of the driving circuit.

OBJECTIVE AND SUMMARY OF THE INVENTION

A main objective of the present invention is to provide a driving circuit for a high side driver circuit which dissipates energy only during a transition from one state to another state.

Essentially the driving circuit of the invention is based upon the use of a memory element, in practice a flip-flop, for driving the power transistor by driving the flip-flop, through the respective SET and RESET terminals, by means of two pulse signals derived from a drive switching signal C.

The first of the pulse signals ($C_S$) is a pulse coinciding with a trailing edge of the drive switching signal C, while the second derived signal ($C_R$) is a pulse coinciding with a rise or front edge of the drive switching signal C.

BRIEF DESCRIPTION OF THE DRAWINGS

The invention and its advantages with respect to the prior art will be more easily understood through the following description of an embodiment thereof and with reference to the accompanying drawings, wherein.

DESCRIPTION OF THE PREFERRED EMBODIMENT

Figure 1:
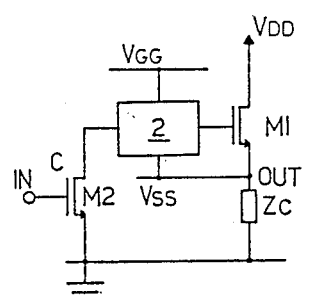
FIG. 1 is a circuit diagram of the driving circuit of a high side driver, in accordance with the prior art.
Figure 2:
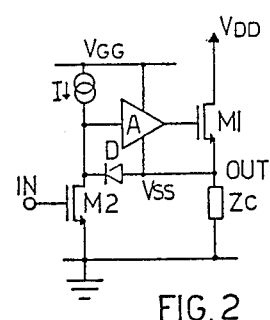
FIG. 2 is an embodiment of the driving circuit of FIG. 1, in accordance with the prior art.
Figure 3:
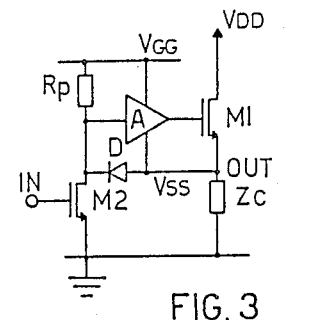
FIG. 3 is another embodiment of the circuit of FIG. 1 in accordance with the prior art.
Figure 4:
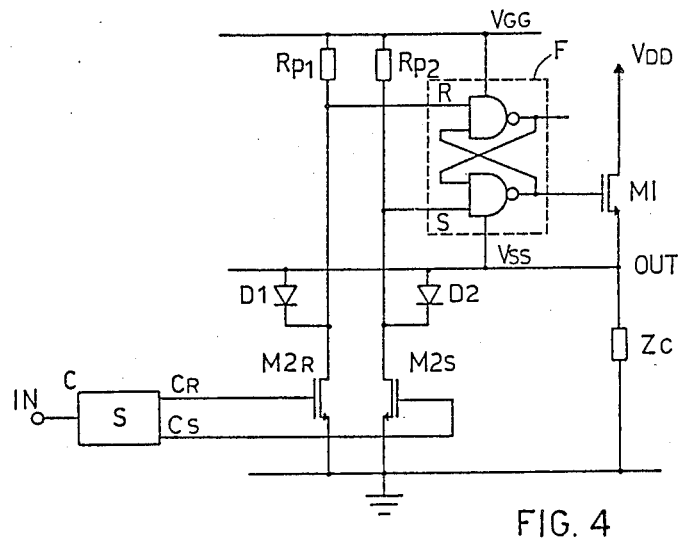
FIG. 4 depicts a driving MOS circuit for a high side driver made in accordance with the present invention.

With reference to FIG. 4, the driving through the gate of the power switching transistor M1 is performed, in accordance with the present invention, by means of a memory element F, which is shown in FIG. 4. The memory element F may be constituted by a SET-RESET type flip-flop supplied from the nodes $V_{GG}$ and $V_{SS}$ of the circuit. The input SET (S) of the flip-flop is connected to the drain of a first, grounded source, input transistor M2S, and the RESET (R) input of the flip-flop is connected to the drain of a second, grounded source, input transistor M2R.

A load element ($R_{p1}$, $R_{p2}$) is connected between the drain of each of the two input transistors, respectively, and the node $V_{GG}$ in order to ensure that the drain potential of the two input transistors is kept at a level corresponding to a stationary logic state 1 when the two transistors are OFF. This load element may be, as shown in FIG. 4, a resistor ($R_{p1}$ and $R_{p2}$, respectively) or a current generator. A diode (D1 and D2, respectively) is preferably connecting between the node $V_{SS}$ (the source or output node of the power switching transistor M1) and the drain of each of the two input transistors M2S and M2R, in order to prevent the drain potential of the two transistors from becoming excessively negative in respect to the $V_{SS}$ when they are conducting.

The two input transistors M2R and M2S are driven by two pulse signals, $C_R$ and $C_S$, respectively, the first of which is a pulse which coincides with the rising edge of the drive switching signal C, while the second is a pulse which coincides with the falling edge of the drive switching signal C. The pulse signals $C_R$ and $C_S$ are derived from the switching signal C, which is applied to an input terminal IN of the driving circuit, by means of any suitable circuit means, indicated by the block S in FIG. 4, and which may be made in various forms as it is well known to a skilled technician.

Figure 5:
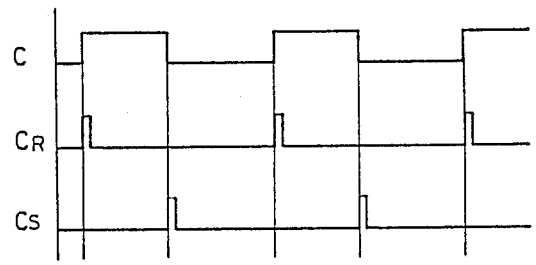
FIG. 5 is a diagram showing the wave shape of the two pulse signals $C_R$ and $C_S$ derived from a drive switching signal C.

The respective wave shape of the signals $C_R$ and $C_S$ relative to a drive switching signal C having a certain "duty-cycle" are depicted in the diagram of FIG. 5.

Figure 6:
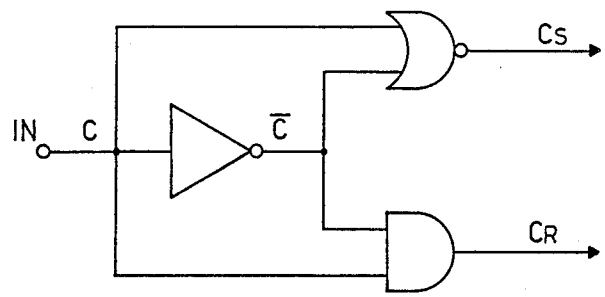
FIG. 6 shows a preferred embodiment of the block S of the circuit of FIG. 4.

There are many methods and circuit arrangements for deriving such two positive pulse signals coinciding respectively with the rising edge and with the falling edge of a typical wave shape of a drive switching signal, for example, derivating and rectifying circuits may be used. A preferred embodiment of such circuit means capable of deriving two positive pulse signals $C_R$ and $C_S$ from a drive switching signal C is depicted in FIG. 6 and is based on the utilization of the delay introduced by an inverting logic gate (an inverter). In the example shown in FIG. 6, essentially a NOT, an AND and a NOR gates are used. A drive switching signal C and the negate $\overline{C}$ thereof which is obtained at the output of the NOT (inverter) gate are applied to two inputs of each of the AND and NOR gates to obtain at the respective outputs two signals given by:

$$C_R = \overline{C} \wedge C \text{ and } C_S = C + \overline{C}$$

Figure 7:
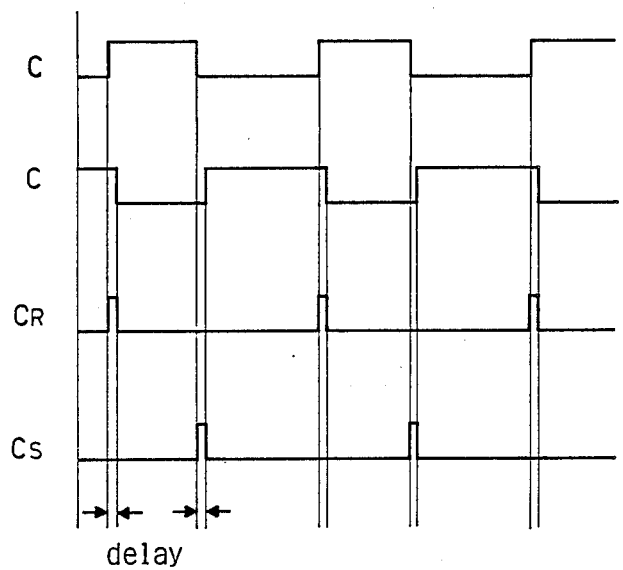
FIG. 7 is a diagram showing the wave shape of the respective signals of the circuit of FIG. 6.

Since the inverted signal $\overline{C}$ is obtained at the output of the inverter has in fact a certain delay in respect to the input signal C, the signals $C_R$ (at the output of the AND gate) and $C_S$ (at the output of the NOR gate) will have the desired characteristics, as graphically shown in the diagram of FIG. 7.

Naturally, the same result may also be obtained through a different arrangement of logic gates and of a different kind of delay elements.

Using the driving circuit of the invention a substantial dissipation (current drawing) by the driving circuit occurs only during transitions, thus fully achieving the objective.

In certain circuit situations it may be useful the use of a buffer stage between the output of the driving memory element F of the driving circuit and the gate of the power swtiching transistor M1.

The driving memory element F, though being depicted in FIG. 4 as formed by two NAND gates, may also be formed with different logic gates or with any other bistable element having suitable characteristics.

What I claim is:

1. A high side driver circuit for switching a supply voltage $V_{DD}$ across a load Zc by means of a power switching transistor M1, which has a drain connected to the supply voltage rail $V_{DD}$, and a source connected to a terminal of the load, the other terminal of the load being connected to the ground, with said power switching transistor being driven by a driving circuit controlled by a drive switching signal C, said circuit comprising;

an input circuit means having an input terminal to which said drive switching signal C is applied, said input circuit means producing at two output terminals thereof, a first pulse signal $C_S$ which is a positive pulse coinciding with a falling edge of said switching signal C and a second pulse signal $C_R$ which is a positive pulse coinciding with a rising edge of said switching signal C, respectively;

a first transistor M2S having a grounded source and being driven by said first signal $C_S$, said first transistor having a drain connected through a load element capable of maintaining the said potential of said transistor at a stationary logic 1 level, when said transistor is turned OFF from a supply node $V_{GG}$ of the circuit;

a second transistor M2R having a grounded source and being driven by said second pulse signal $C_R$ and having a drain connected through a load element capable of maintaining the drain potential of said transistor at a stationary logic 1 level when said transistor is turned OFF from said supply node $V_{GG}$ of the circuit;

a SET-RESET type flip-flop having a SET input terminal connected to the drain of said first transistor M2S and a RESET input terminal connected to the drain of said second transistor M2R and having an output terminal connected to the gate of said power switching transistor M1;

wherein a constant potential difference is being maintained between said supply node $V_{GG}$ of the circuit and the source of said power switching transistor M1 by means of a voltage generator, and wherein said driving circuit dissipates only during transitions from one state to another.

2. The circuit according to claim 1, wherein said input circuit means comprise a logic NOT gate, a logic AND gate and a logic NOR gate;

said drive switching signal C being applied to an input of each of said logic gates, the output signal $\overline{C}$ of said NOT gate having a certain delay with respect to the input switching signal C and being applied to a second input of each of said other logic AND and NOR gates, thus obtaining at the respective output terminals of said gates two pulse signals $C_R$ and $C_S$.

3. The circuit according to claim 1, wherein said load of each the transistors M2S and M2R is a resistor.

4. The circuit according to claim 1, wherein said load of each the transistors M2S and M2R is a current generator.

5. The circuit according to claim 1, wherein a limiting diode is connected between the source of the power switching transistor M1 and the drain of each of said two transistors M2S and M2R, respectively.

* * * * *